Figure 1:
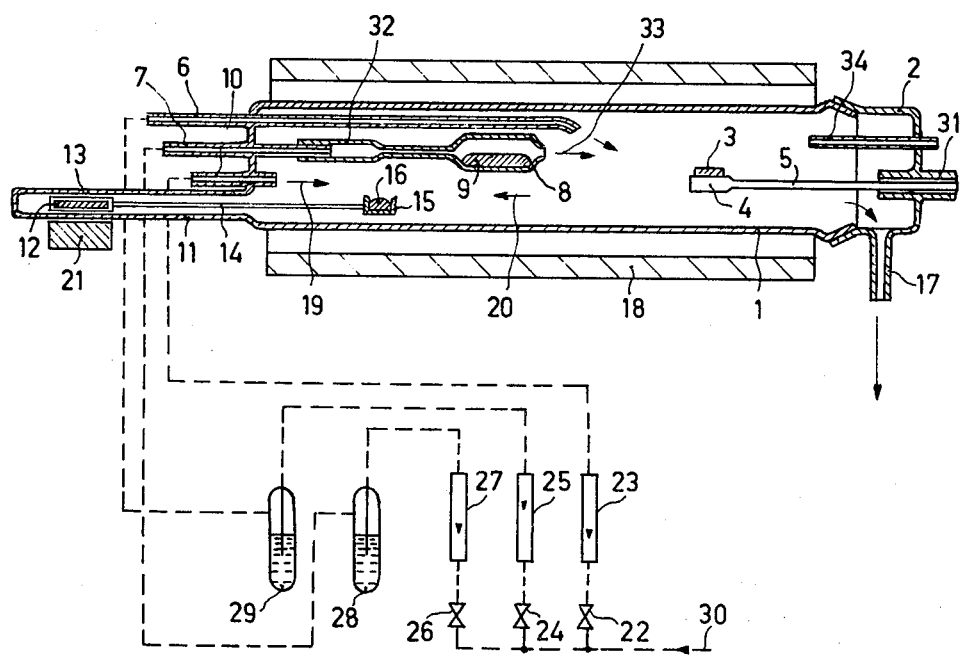

United States Patent [19]
Boucher

[11] 3,979,235
[45] Sept. 7, 1976

[54] DEPOSITING DOPED MATERIAL ON A SUBSTRATE

[75] Inventor: André Boucher, Sevres, France

[73] Assignee: U.S. Philips Corporation, New York, N.Y.

[22] Filed: Jan. 6, 1975

[21] Appl. No.: 538,717

[30] Foreign Application Priority Data
Jan. 10, 1974 France .............................. 74.00838

[52] U.S. Cl. .............................. 148/175; 148/174; 148/189; 148/1.5
[51] Int. Cl.² ............................................ H01L 7/36
[58] Field of Search ............. 148/175, 174, 189, 1.5

[56] References Cited
UNITED STATES PATENTS

| | | | |
|---|---|---|---|
| 3,065,062 | 11/1962 | Enk et al. ........................ | 75/65 ZM |
| 3,421,952 | 1/1969 | Conrad et al. ...................... | 148/175 |
| 3,492,175 | 1/1970 | Conrad et al. ...................... | 148/175 |
| 3,701,682 | 10/1972 | Gartman et al. ................. | 148/175 X |
| 3,764,414 | 10/1973 | Blum et al. ........................ | 148/189 |

OTHER PUBLICATIONS

Effer, *J. of Electrochemical Soc.*, vol. 112, No. 10, Oct. 1965, pp. 1020–1024.
Tietjen et al., *RCA Review*, Dec. 1970, pp. 635–646.

*Primary Examiner*—G. Ozaki
*Attorney, Agent, or Firm*—Frank R. Trifari; Norman N. Spain

[57] ABSTRACT

A method of providing doped material on a substrate by chemical vapour deposition using a reactive gas.

Variations in the doping level are obtained by displacing the doping source along a flow of non-reactive gas having a constant supply in order to vary the amounts of dopant converted to the vapour phase due to retrodiffusion of reactive vapours towards the doping source.

Application to semiconductor devices in particular of the III-V type, especially for high-frequency devices.

10 Claims, 4 Drawing Figures

DEPOSITING DOPED MATERIAL ON A SUBSTRATE

The present invention relates to a method of providing a material incorporating at least one dopant by chemical vapor deposition on a substrate, in which method a flow of reactive gas comprising vapors containing the components of the material to be deposited is passed in a carrier gas along the substrate which is placed in a reaction chamber for the deposition by chemical reaction, a source of at least one of the dopants in a non-gaseous phase being placed in the reaction chamber but outside the path of the reactive gas flow, and a supply of gas, non-reactive to said source, being conveyed on to said source and towards the path of said reactive gas flow.

Various methods are used for the deposition on a substrate of a material starting from the component or components of the material in the vapor phase, in elementary form or in the form of compounds. Some of these methods take into account the necessity of growing a layer of a material containing dopants. In particular, the method and the device for carrying out said method which form the object of the U.S. Pat. No. 3,901,746, allow the forming of deposits with a determined doping and even superimposing successive layers having different doping levels. The latter result is obtained by varying the flow of a non-reactive gas to the source of deposits carried in the flow of said non-reactive gas in the direction of the reactive gas flow which is drawn along by a carrier gas current in the direction of the substrate. Said method uses actually the retroduffusion of the reactive gases in a supply of non-reactive gas to deduct from the source of impurities, by chemical attack, a quantity of doping material which can be controlled by controlling the said supply of non-reactive gas. In certain cases of composite materials, however, the possible influence of the control of the supply of nonreactive gas on the concentration of the components into the reactive gas flow may involve modifications of the growth conditions.

The main object of the invention is to mitigate said inconvenience and to permit a modification of the doping level without the risk of modifying the growth conditions of a layer of the depositing material from the vapour phase.

Another object of the invention is to allow the depositing of doped materials having very weak but controllable doping levels.

Another object of the invention is to permit the instantaneous control of the variations in the doping level in a crystal layer of the material during its deposition from the vapor phase.

According to the invention there is provided a method of forming a layer of material containing at least one deposit inpurity by chemical vapour deposition on a substrate. In the method of the invention a flow of a reactive gas containing vapors prising the components of the said material in a carrier gas is passed along the substrate which is placed in a reaction chamber for the deposition by chemical reaction, a source of at least one dopant in a non-gaseous phase is placed in the reaction chamber outside the path of the reactive gas flow, and a supply of gas non-reactive to said dopant source is conveyed along said dopant source towards the path of the reactive gas flow and, the concentration of the dopant or dopants from said source in the deposited layer being modified during the deposition by a displacement of said source along the flow of non-reactive gas. In this process the supply of the non-reactive gas need not be varied.

Since the supply of the non-reactive gas remains constant the dilution rates of the various vapours reaching the region of the substrate can remain constant and the reaction conditions and the growth conditions are not likely to be disturbed. The effect of the retrodiffusion is used but the control of said effect is obtained without the modification of any supply of gas, reactive or non-reactive, the control of the effect of the retrodiffusion is only obtained by varying the position of the source of doping material with respect to the diffusion, in counter-current, of reactive vapours susceptible of attacking said source.

In a first embodiment of the method, the zone of the reaction chamber in which the impurity source can be displaced is substantially at a uniform temperature, said temperature may be chosen in relation to the desired conditions of attacking said diffusing reactive vapors resulting in the release of vapors capable of supplying the doping element in the conditions prevailing in the zone of the substrate.

This embodiment corresponds to the use of doping sources of which the vapour pressure is very small or of which the reaction rate with the reactive vapours is very slightly influenced by the temperature and is practically always 100%.

In another preferred embodiment of the method, the zone of the reaction chamber in which the source of dopants can be displaced has a temperature gradient in the direction of the displacement. Preferably, said temperature gradient is constant all along the zone of displacement. This embodiment may advantageously be used when the source of dopants has a vapour pressure which can substantially be varied in a temperature range which is used in practice, the reaction rate with the reactive vapours being thus dependent on the temperature.

The effect of the temperature gradient along the possible zone of displacement of the doping source is either additional to that of the retrodiffusion, or counteracting it in accordance with the sense of the temperature gradient and the type of reactions involved. When abrupt variations of the doping level must be obtained, it is advantageous to provide such a temperature gradient that its effect is additional to the effect of the retrodiffusion. When very small variations of the doping level must be obtained, it is advantageous to use such a temperature gradient that its effect is opposite to that of the retrodiffusion, in most cases the temperature of the zone of displacement having to be chosen to be lower on the side of the substrate than on the inlet side of the non-reactive gas flow, the temperature gradient, or rather the constant supply of non-reactive gas, being such that the two effects do not compensate each other exactly.

The gases and vapours used in the method according to the invention may be the same as those used in the known methods and in particular those used in the method forming the subject matter of the above-mentioned U.S. Pat. No. 3,901,746; hence, the non-reactive gas for the doping source and conveyed on the latter in the direction of the reactive gas flow may be used as a carrier gas; likewise, the gases forming the reactive vapours conveyed in the space for the reaction of the deposit may be reactive to the doping source.

It is known that the properties of a deposited layer, prior to being doped to a determined level may be considerably varied if other, undesired, impurities start contaminating the materials, the gases and the vapors used before and during the deposit and that therefore the air-tightness and the absence of gas-leaks of the chamber, of the joints and the ducts will be promoted. The joints, for example with rotating and/or sliding members, are usually sources of undesired impurities. According to a preferred embodiment of the method according to the invention, the displacement movement of the source of dopants is achieved by means of a magnetic means applied from outside the chamber. For example, the doping source may be placed in the chamber, on a movable support forming one assembly with a magnetic mass the movement of which is produced by the displacement of a magnetic outside the space. Thus, the desired control may be obtained without a joint and without a valve, and the possibilities of pollution inside the reaction space are reduced, in particular if it is ensured that other joints or connections which may bring in any contamination are also omitted.

The present invention may be applied to different types of deposits of crystalline materials by reaction from the vapour phase and in particular to deposits of epitaxial layers of doped semiconductor materials on adequate substrates. An example of the application is the manufacture of Gunn effect semi-conductor devices comprising successive epitaxial layers of N+ N N+ conductivity types.

Since most semiconductor devices necessitate a precise and immediate control of the doping and doping level, they may advantageously be manufactured using the method according to the invention, in particular in the case of abrupt and precise variations to be produced in a range of very low concentration levels.

The invention can be applied to the deposit of composite semiconductor materials, so-called III-V compounds, comprising at least one element of column III and at least one element of column V of the periodic table of elements. The doping impurities used in this case may be chosen from the group comprising tin, zinc, tellurium, chromium and iron particularly when the deposited material consists of gallium arsenide.

The invention will be described in greater detail, by way of example, with reference to the accompanying drawing, in which, FIG. 1 is a diagrammatic sectional view of a device for carrying out the method according to the invention.

Figure 2:
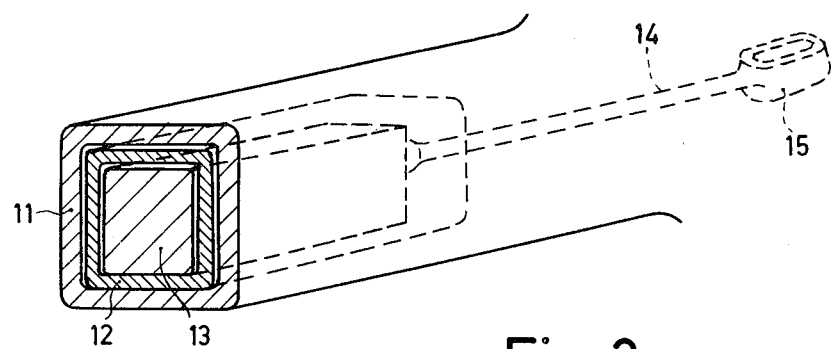
Figure 3:
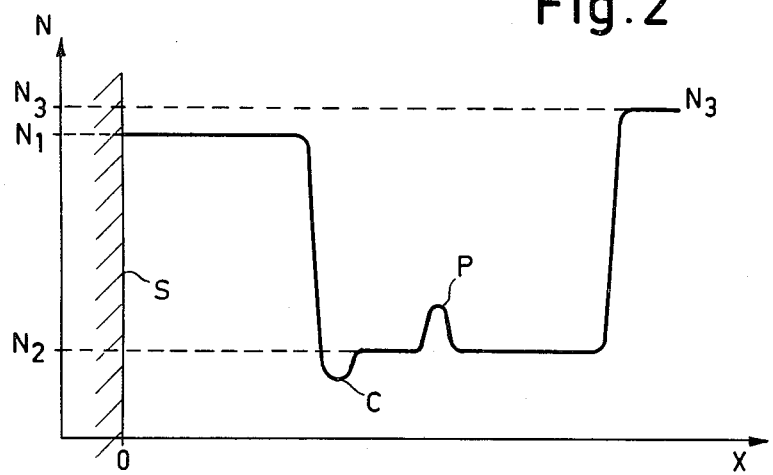
Figure 4:
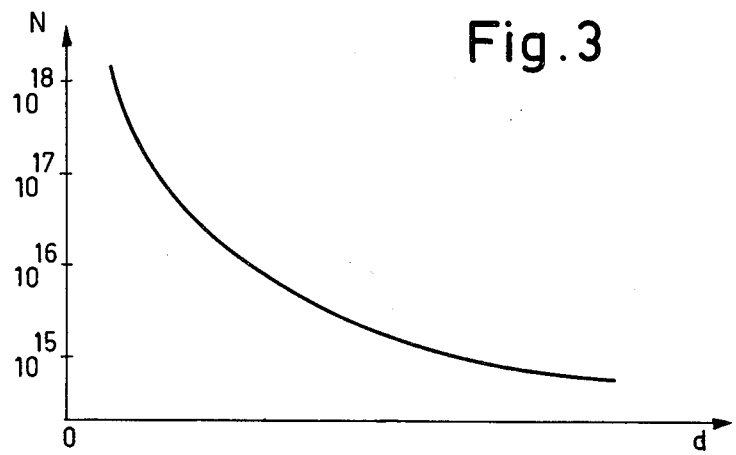

FIG. 2 is a detailed cross-sectional view of the means to displace the doping source of the device shown in FIG. 1, FIG. 3 is a diagram showing a curve of the variation of the concentration of dopants of a deposit formed according to the method according to the invention, FIG. 4 is a diagram showing a concentration curve of dopants in a deposit as a function of the position of the doping source in a device according to the invention.

The device shown diagrammatically in FIG. 1 is an example of the means for carrying out the invention in the case of a deposit of a III-V semi-conductor compound, such as gallium arsenide. It comprises a reaction chamber comprising a horizontal tube 1, preferably of transparent vitreous silica, closed at the two extremities, one of which by means of a ground glass stopper 2. A rod 5 carrying at its extremity a substrate support 4 on which the substrates are placed passes through the stopper 2. The position of the substrate 3 can be controlled along the tube 1 due to the slide present at 31 and permitting an airtight control of the position of the substrate 3.

At the other extremity, an end wall of the tube 1 is traversed by: a first tube 6 emerging in the direction of the substrate 3, a second tube 7 emerging at 33 whose mouth is shaped to serve as a receptacle 8 for the mass 9 of the least volatile component of the material to be deposited for example, gallium in the case of gallium arsenide, and a third tube 10 emerging in the same direction as the two first but further back with respect to them.

Before carrying out the actual deposit, the tube 6 may serve to convey an etching gas on the substrate. Conducted through the tube 7 is a reactive gas which may be diluted with a carrier gas, containing the most volatile component of the material to be deposited, for example, arsenic trihalide in the case of gallium arsenide. Through the tube 10 is conveyed a non-reactive gas, for example, hydrogen. Said gas is conveyed along a container 15 in which a small quantity 16 of doping material is provided. The container 15 is held at the extremity of a rod 14 forming one assembly with a boat 12 having a square section and comprising a bar 13 of magnetic material. The boat 12 can slide in a tube 11 which is closed at one end and has a square section, the boat 12 may be displaced by means of a magnet 21. Said part of the device is shown in detail in FIG. 2.

The tube 7 consists of two pieces comprising a sleeve 32 so as to be able to easily and rapidly exchange the receptacle 8.

The stopper 2 comprises in addition a tube 17 destined to exhaust the gases which have reached the extremity of the space 1.

The space 1 is placed in a furnace 18 having several zones. The various zones are controlled at least to maintain on the one hand the receptacle 8 and its contents at the desired reaction temperature, and on the other hand to obtain the temperature of the substrate necessary for the growth of the deposit. The required temperature conditions in the known methods remain valid for the application of the method according to the invention.

In the example described here, a non-reactive carrier gas is led in at 30. A first supply controlled by a valve 24 and checked by a supply gauge 25 flows in a bubbler 29 where it is charged with reactive vapours and serves to etch the substrate, only before effecting the deposit.

A second supply controlled at 26 and checked at 27 flows in a bubbler 28 containing an arsenic halide and is conveyed to the gallium 9 placed in the receptacle 8. A third supply, controlled at 22 and checked at 23 is conveyed in the space at 19.

A dissociation of arsenic halide is produced on the track leading to the receptacle 8. The vapours leaving at 33 thus comprise hydrogen halide which is susceptible of attacking the element 16 placed in the container 15. The said third supply arriving at 19 limits the retroduffusion, in the direction of the arrow 20, of reactive vapours which emanate in the space 1 through the orifice of the receptacle 8. The effect of the supply directed according to 19 is more or less efficacious according to the position of the source of doping element 16. The attack of the latter is thus controllable leaving the supply controlled by the valve 22 at a fixed value by voluntarily displacing the rod 14 by means of the magnet 21. The curve of FIG. 4 gives an example of the influence of the position of the source of doping element on the concentration of doping impurities of a deposit effected with a device of the type described above. In said curve, the concentration in number of atoms per cm$^3$ is indicated as a function of the distance $d$ between the source of doping element and the outlet of reactive vapours (distance between the container 15 and the outlet 33 in the diagrammatic drawing of FIG. 1.).

Another control of the doping may be carried out according to a known method, simultaneously or not simultaneously with the control effected according to the invention, by modifying the position of the substrate with respect to an inlet of doping products debouching in the reaction space at a small distance from the outlet point of the gases. In the device shown in FIG. 1, for example, a tube 34 is used for conducting into the space vapours charged with a doping element which may be different from that which the source 16 supplies. For example, the second dopant is sulphur, the first dopant dosed according to the method of the invention being tin. The position of the substrate 3 with respect to the outlet of the tube 34 controlled by operating the rod 5 sliding at 33, for example, by means of a magnetic mass and a magnet, in the same manner in which the position of the source 16 is controlled. The heating zone of the furnace 18 in which the substrate 3 can be displaced is isothermal so as not to disturb the deposition conditions when the substrate is displaced.

The control of the doping by displacement of the substrate is less precise than the control according to the invention by displacement of the doping source and can be used to produce large concentration differences. FIG. 3 gives an example of a curve of the variation of the concentration in charge carriers N of an epitaxial deposit of gallium arsenide effected on a substrate plate, as a function of the depth in a direction perpendicular to the deposition surface, the mark O corresponding to the surface S of the substrate, the deposit being effected by using the two control means described.

The deposit is first effected on a substrate placed near an inlet of a first doping, giving it a concentration $N_1$, the source provided for a second doping and used according to the invention being placed in the position which is farthest away from the outlet of the reactive vapours. The substrate is then rapidly removed from the inlet of the first dopant which is simultaneously closed. After a rapid variation, shown by the cavity C, the residual concentration established at $N_2$. At the desired instant, the container containing the second dopant is moved momentarily in the direction of the outlet of the reactive vapours, at the desired distance and during the desired time. Thus a peak P is obtained of the concentration curve. If necessary, the concentration is again strongly increased up to $N_3$ by displacing the substrate in the direction of the inlet of the first dopant, supplied again. The possibility of obtaining concentration profiles of the type of FIG. 3 is used, for example, in the manufacture of certain hyperfrequency devices.

The above described example presented for illustrating the invention more clearly, is not limitative for the scope of the invention, as will be clear to those skilled in the art. The latter may choose other materials to be deposited, comprising other doping material. Further, the reactive gas mixture may comprise reactive substances other than compounds comprising a component of the material to be deposited.

What is claimed is:

1. A method of depositing a thin layer containing at least one dopant on a suitable substrate, placed in a reaction chamber, by chemical vapor deposition, said method comprising: passing a flowing reactive gas stream of a carrier gas containing vapors of components capable of reacting to form the deposited layer, placing a source of at least one dopant in non-gaseous form for said layer inside said reaction chamber but outside said flowing reactive gas stream, passing a flowing stream of a gas non-reactive with said source along said source toward the path of said flowing reactive gas stream and controling the resultant concentration of dopant from said source in the resultant deposited layer by moving said source along said path of the flowing stream of the non-reactive gas.

2. A method as claimed in claim 1, characterized in that the zone of the reaction chamber in which the impurity source can be displaced is substantially at a uniform temperature.

3. The method of claim 1 wherein the deposition is epitaxial and is deposited on a monocrystalline substrate.

4. The method of claim 1 wherein the dopant source is moved by magnetic means placed outside of the reaction chamber.

5. The method of claim 1 wherein the temperature of the zone in which said source is moved has a temperature gradient in the direction of the movement of said source.

6. A method as claimed in claim 5, characterized in that the temperature gradient along the zone of movement of the source of dopants is uniform.

7. A method as claimed in claim 1 in which the material which is deposited on the substrate is a semiconductor material incorporating at least one dopant.

8. A method as claimed in claim 7 in which the said semiconductor material essentially comprises at least one element of column III and one element of column V of the periodic table of the elements.

9. A method as claimed in claim 8, characterized in that the doping impurities are chosen from the group consisting of tin, zinc, tellurium, chromium and iron.

10. A method as claimed in claim 9 in which the deposited material is gallium arsenide.

* * * * *